US011869959B2

(12) United States Patent
Gautier (10) Patent No.: US 11,869,959 B2
(45) Date of Patent: Jan. 9, 2024

(54) OXIDE FIELD TRENCH (OFT) DIODE CONTROL DEVICE

(71) Applicant: STMicroelectronics (Tours) SAS, Tours (FR)

(72) Inventor: Frederic Gautier, Monnale (FR)

(73) Assignee: STMicroelectronics (Tours) SAS, Tours (FR)

( * ) Notice: Subject to any disclaimer, the term of this patent is extended or adjusted under 35 U.S.C. 154(b) by 188 days.

(21) Appl. No.: 17/412,556

(22) Filed: Aug. 26, 2021

(65) Prior Publication Data
US 2022/0069110 A1 Mar. 3, 2022

(30) Foreign Application Priority Data

Aug. 28, 2020 (FR) ...................................... 2008791

(51) Int. Cl.
*H02M 3/335* (2006.01)
*H01L 29/739* (2006.01)
*H01L 27/07* (2006.01)
*H01L 29/872* (2006.01)
*H03K 17/74* (2006.01)

(52) U.S. Cl.
CPC ...... *H01L 29/7392* (2013.01); *H01L 27/0727* (2013.01); *H01L 29/8725* (2013.01); *H02M 3/33592* (2013.01); *H03K 17/74* (2013.01)

(58) Field of Classification Search
CPC ............. H01L 29/7392; H01L 29/8725; H01L 27/0727; H02M 3/33592; H03K 17/74; H03K 17/302; H03K 2017/307; H03K 2217/0009; H03K 2217/0081
See application file for complete search history.

(56) References Cited

U.S. PATENT DOCUMENTS

| 7,120,036 B2 | 10/2006 | Kyono | |
| 10,333,425 B1* | 6/2019 | Heath | ...................... H02M 1/08 |
| 2002/0141214 A1* | 10/2002 | Grover | .............. H02M 3/33592 |
| | | | 363/125 |
| 2016/0380554 A1 | 12/2016 | Baur et al. | |
| 2019/0372476 A1 | 12/2019 | Pidutti et al. | |

FOREIGN PATENT DOCUMENTS

| DE | 10336237 A1 | 3/2005 |
| EP | 1133048 A2 | 9/2001 |
| JP | H08-298241 A | * 11/1996 |

OTHER PUBLICATIONS

NPI Search Report and Written Opinion for FR 2008791 dated Apr. 21, 2021 (8 pages).

* cited by examiner

*Primary Examiner* — Kyle J Moody
*Assistant Examiner* — Jye-June Lee
(74) *Attorney, Agent, or Firm* — Crowe & Dunlevy (57) ABSTRACT

A device includes a controllable current source connected between a first node and a first terminal coupled to a cathode of a controllable diode. A capacitor is connected between the first node and a second terminal coupled to an anode of the controllable diode. A first switch is connected between the first node and a third terminal coupled to a gate of the controllable diode. A second switch is connected between the second and third terminals. A first diode is connected between the third terminal and the second terminal, an anode of the first diode being preferably coupled to the third terminal.

36 Claims, 4 Drawing Sheets

OXIDE FIELD TRENCH (OFT) DIODE CONTROL DEVICE

PRIORITY CLAIM

This application claims the priority benefit of French Application for Patent No. 2008791, filed on Aug. 28, 2020, the content of which is hereby incorporated by reference in its entirety to the maximum extent allowable by law.

TECHNICAL FIELD

The present disclosure generally concerns electronic circuits, and more particularly, a device for controlling a controllable diode such as an OFT ("Oxide Field Trench") diode.

PRIOR ART

Figure 1:
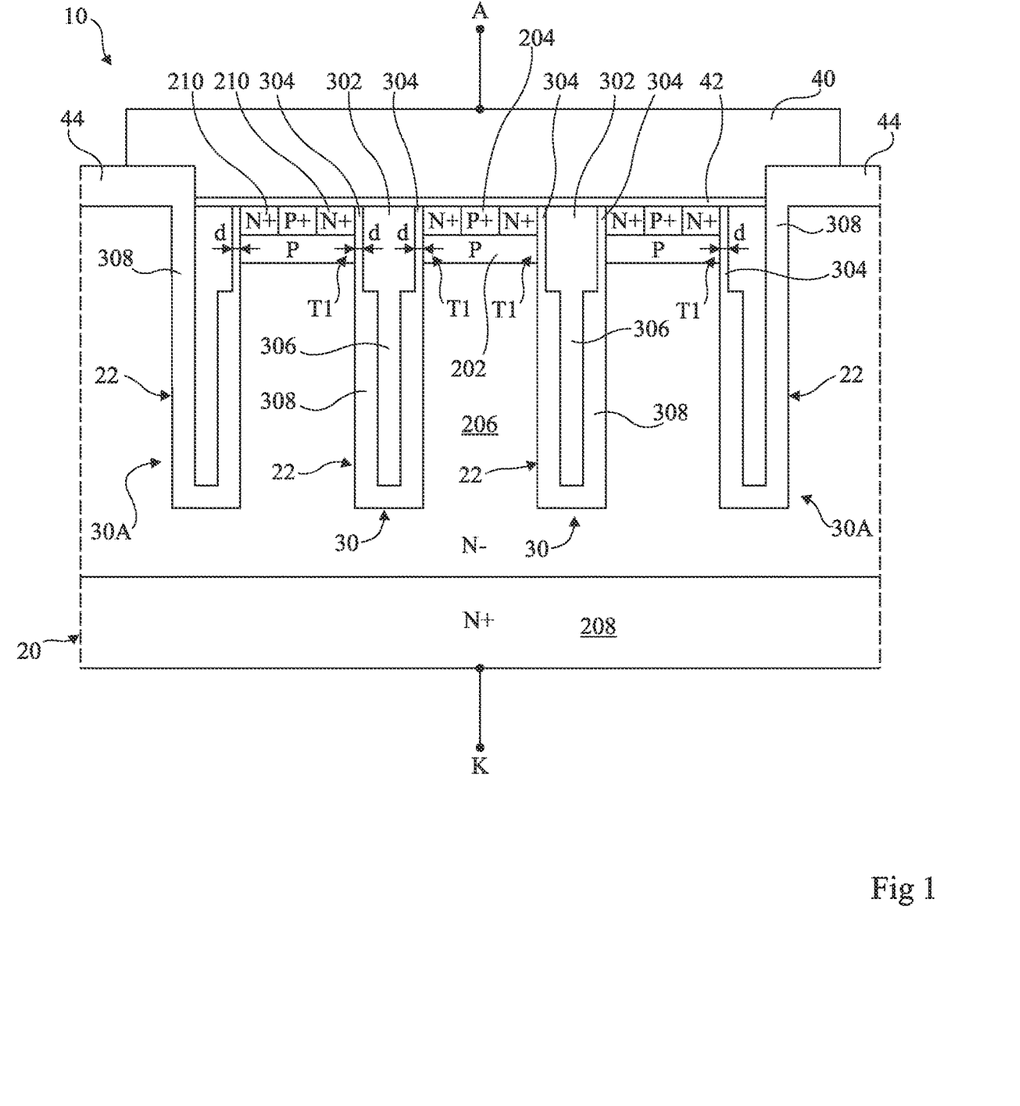
FIG. 1, previously described, is a copy of FIG. 1 of United States Patent Application Publication Number 2020/105946, illustrating an example of an oxide field trench (OFT) diode.

FIG. 1 is a copy of FIG. 1 of United States Patent Application Publication No. 2020/0105946, which is incorporated herein by reference in its entirety to the maximum extent allowable by law. FIG. 1 shows an example of an Oxide Field Trench (OFT) diode 10.

Diode 10 comprises a semiconductor substrate 20, for example, made of silicon. Diode 10 comprises a cathode terminal K, for example, electrically connected to a lower surface of the substrate, and an anode terminal A. Diode 10 comprises trenches 22 extending in substrate 20 from the upper surface of substrate 20. Trenches 22 are, for example, regularly spaced apart, and, for example, parallel to one another or in the shape of concentric rings.

Diode 10 comprises structures 30A, described hereinafter, each located in a trench 22, for example, two structures 30A on either side of diode 10. Preferably, between structures 30A, diode 10 further comprises one or a plurality of structures 30.

Each structure 30 comprises, in the concerned trench 22, an electrically-conductive region 302 located in an upper portion of trench 22. Region 302 is separate from the walls of trench 22, that is, from substrate 20, and is, for example, separated from the walls of the concerned trench 22 by one or a plurality of dielectric layers 304, arranged on either side of region 302. Region 302 and the walls of trench 22 are separated by a short distance d, preferably shorter than 10 nm, for example, shorter than 7 nm.

Each structure 30 further comprises an electrically-conductive region 306 extending in the trench lower (or deeper) than region 302. In the example illustrated in FIG. 1, regions 302 and 306 are one piece, although, as a variant, the two regions 302 and 306 may be separate and electrically insulated from each other by one or a plurality of dielectric layers, the two regions 302 and 306 then extending from the upper surface of substrate 20.

Region 306 is, for example, located farther away from the walls of trench 22 than region 302. Region 306 is for example separated from substrate 20 by one or a plurality of dielectric layers 308 covering the walls and the bottom of trench 22. The thickness of layer 308 is, for example, greater than approximately 100 nm, preferably in the range from 250 nm to 1,000 nm.

Structures 30A use the same elements as structures 30. However, in structures 30A, the above-mentioned distance d is absent on the outer side of diode 10. As an example, layer 308 then extends between region 302 and the wall of the concerned trench 22, on the outer side of diode 10. Layer 308 may join an insulating layer 44 covering the substrate on the diode periphery.

As an example, regions 302 and 306 are made of doped polysilicon, and layers 304 and 308 are made of silicon oxide.

A transistor T1 may then be formed in the portion of substrate 20 in contact with each layer 304, the considered region 302 forming the gate of transistor T1. As an example, transistors T1 have an N channel. Each transistor T1 comprises a P-type doped channel region 202 (P). As an example, each channel region 202 extends between two neighboring trenches 22 and is thus common to two neighboring transistors T1. Preferably, each region 202 has a central region topped with a contacting area 204 (P+), more heavily P-type doped than region 202.

Each transistor T1 further comprises a drain region 206 (N−) located under channel region 202. As an example, each drain region 206 extends between two neighboring trenches 22 and is common to the neighboring transistors T1. Drain regions 206 may continue under trenches 22 and may then meet under trenches 22. Regions 206 are for example on top of and in contact with a contacting region 208 (N+) extending on the lower portion of substrate 20 and being electrically coupled to terminal K.

Each transistor T1 further comprises a source region 210 (N+) preferably located against layer 304. Source region 210 is, for example, more heavily N-type doped than drain region 206.

In diode 10, gate regions 302, source regions 210, and the contacting regions 204 of transistors T1 are preferably electrically connected to anode terminal A. Thus, diode 10 is defined by one or a plurality of transistors T1. To achieve this, as an example, a conductive layer 40, possibly resting on an interface layer 42, covers substrate 20 and trenches 22. Regions 302 and 306 extend in trenches 22 from layer 40 or the possible interface layer 42.

Thus, in FIG. 1, OFT diode 10 comprises a plurality of structures 30A and possibly 30. Each structure 30A, 30 comprises, in the concerned trench 22, conductive region 302 separated from substrate 20 by distance d shorter than approximately 10 nm, and conductive region 306 extending deeper into substrate 20 than region 302. Diode 10 is defined by one or a plurality of transistors T1, having at least a channel region 202 extending between two of trenches 22. Regions 302 define the gates of transistors T1 of diode 10, that is, a gate of diode 10. Diode 10 comprises a contacting region 204 electrically coupling the channel region 202 of each transistor T1 of diode 10 to an anode conductive layer 40.

An OFT diode 10 as described in relation with FIG. 1 has a low reverse leakage current and a low forward voltage drop when it is properly controlled via a gate potential. This makes the OFT diode 10 a good candidate to replace MOS transistors controlled in synchronous rectification or non-controllable (gateless) diodes in applications where the lowest possible reverse currents and the lowest possible voltage drops are targeted, for example, in power applications.

It would be desirable to have an oxide field trench (OFT) diode control device overcoming all or part of the disadvantages of known OFT diode control devices.

It would also be desirable to have a dipole including an OFT diode and an OFT diode control device overcoming all or part of the disadvantages of known OFT diode control devices. Indeed, such a dipole would, for example, enable to replace a non-controllable diode of a circuit with this dipole, without further modifications of the circuit.

SUMMARY

An embodiment overcomes all or part of the disadvantages of known oxide field trench (OFT) diode control devices.

An embodiment provides a dipole including an OFT diode and a device for controlling the OFT diode overcoming all or part of the disadvantages of known OFT diode control devices.

One embodiment provides a device including: a controllable current source connected between a first node and a first terminal coupled to a cathode of a controllable diode; a capacitor connected between the first node and a second terminal coupled to an anode of the controllable diode; a first switch connected between the first node and a third terminal coupled to a gate of the controllable diode; a second switch connected between the second and third terminals; and a first diode connected between the third terminal and the second terminal, an anode of the first diode being preferably coupled to the third terminal.

According to one embodiment, the device includes a circuit configured to control the current source, the first switch, and the second switch, based upon a potential difference between the first and second terminals.

According to one embodiment, the circuit is configured to: control a delivery of a current to the capacitor from the source when the potential difference is smaller than a first threshold, preferably negative or zero; control the first switch to the on-state when the potential difference is greater than a second threshold, preferably positive or zero; and control the second switch to the on-state when the potential difference is lower than a third threshold, preferably negative or zero.

According to one embodiment: the current source is a first NPN-type bipolar transistor having an emitter coupled to the first node and a collector coupled to the first terminal; the first switch is a second PNP-type bipolar transistor, having an emitter coupled to the first node and a collector coupled to the third terminal; and the second switch is a third NPN-type bipolar transistor having an emitter coupled to the second terminal and a collector coupled to the third terminal.

According to one embodiment, the circuit includes: a first resistor coupling the first terminal to a base of the first transistor; a second resistor coupling the first terminal to a base of the second transistor; a second diode connected between the base of the first transistor and the base of the second transistor, an anode of the second diode being coupled to the base of the first transistor; and a third diode connected between the base of the second transistor and a base of the third transistor, an anode of the third diode being coupled to the base of the second transistor.

According to one embodiment, a threshold voltage of the second diode is equal to a threshold voltage of a base-emitter diode of the first transistor.

According to one embodiment, a maximum voltage across the capacitor is at least partly determined by a threshold voltage of the third diode.

According to one embodiment: the first threshold is at least partly determined by a threshold voltage of the first diode; or the circuit includes a diode, preferably a Zener diode, series-connected with the first resistor between the first terminal and the base of the first transistor, the first threshold being at least partially determined by a reverse conduction threshold voltage of the diode.

According to one embodiment, the second threshold is at least partly determined by a threshold voltage of the third diode and/or by a threshold voltage of the controllable diode.

According to one embodiment: the third threshold is at last partly determined by the threshold voltage of the third diode; or the circuit further includes a diode in series with a third resistor between the first terminal and the base of the third transistor, the third threshold being at least partly determined by a threshold voltage of the diode.

According to one embodiment: the circuit further includes a resistor connected between the base of the third transistor and the second terminal; and/or the circuit includes a diode for desaturating the third transistor, connected between the base and the collector of the third transistor.

According to one embodiment, the device includes an inductance having a terminal connected to the second terminal and having another terminal coupled to the anode of the controllable diode.

According to one embodiment, the controllable diode is an OFT diode including a plurality of structures each having, in a trench of a substrate, a first conductive region separated from the substrate by a first distance shorter than approximately 10 nm, and a second conductive region extending in the trench deeper than the first region, the diode being defined by one or a plurality of transistors each having at least a channel region extending between two of the trenches, the first conductive regions defining the gates of the transistors and a gate of the diode.

A further embodiment provides a dipole including: the above-described device, the first terminal of the device defining a cathode of the dipole and the second terminal of the device defining an anode of the dipole; and a controllable diode, preferably an OFT diode, having a cathode connected to the first terminal of the device, an anode coupled to the second terminal of the device, and a gate connected to the third terminal of the device.

A further embodiment provides a switched-mode power supply including the above-described device or the above described dipole.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the steps and elements that are useful for an understanding of the embodiments described herein have been illustrated and described in detail. In particular, usual electronic circuits, for example, switched-mode power converters or rectifying bridges, comprising a dipole implementing a diode function, for example, rectifying, have not been detailed, the described embodiments being compatible with such usual circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 2:
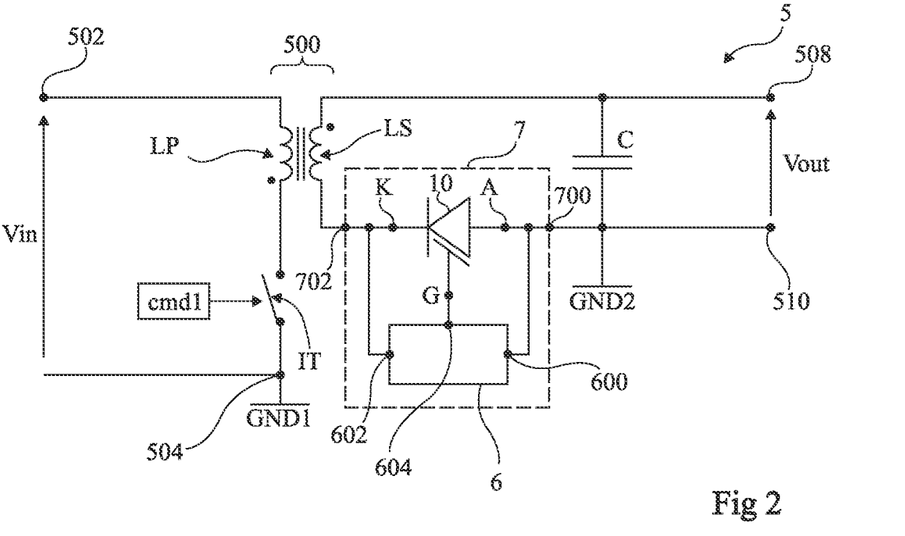
FIG. 2 schematically shows, in the form of a circuit, an embodiment of a power converter comprising an OFT diode and its control device according to an embodiment.

FIG. 2 schematically shows, in the form of a circuit, an embodiment of a switched-mode power supply (SMPS) comprising an oxide field trench (OFT) diode, for example, the diode 10 of FIG. 1, and its control device 6 according to an embodiment. In this example, diode 10 and its control device, or circuit, 6 are shown in the form of a dipole 7 (delimited by dotted lines in FIG. 2), with dipole 7 comprising an anode terminal 700 and a cathode terminal 702.

Switched-mode power supply 5 is in this example a galvanic isolation power supply comprising an isolation transformer 500. More particularly, a switched-mode power supply 5 is commonly called "fly-back" power supply.

Transformer 500 comprises a primary winding LP and a secondary winding LS.

Primary winding LP is series-connected with a switch IT, between a terminal 502 having an input potential Vin applied thereto and a terminal 504 having a reference potential GND1 applied thereto. Vin is referenced to GND1. As an example, switch IT is connected between winding LP and terminal 504. In this example, the phase point of winding LP is on the side of terminal 504.

Switched-mode power supply 5 comprises a circuit cmd1 for controlling switch IT. Circuit cmd1 is configured to control switch IT to the off-state and to the on-state, based on a difference between a set point value and a constant (or measured) value of an output potential Vout of power supply 5, so that potential Vout is regulated on the set point value.

Dipole 7 is series-connected with winding LS, between a terminal 508 of delivery of potential Vout and a terminal 510 of application of a reference potential GND2 having potential Vout referenced thereto. A filtering capacitor C is connected between terminals 508 and 510, in parallel with the series association of dipole 7 and of winding LS.

In this example, the phase point of winding LS is on the side of terminal 508. In this example, anode 700 of dipole 7 is coupled, preferably connected, to terminal 510 and the cathode 702 of dipole 7 is coupled, preferably connected, to winding LS.

Control device 6 comprises a terminal 600 coupled, preferably connected, to anode A of diode 10, a terminal 602 coupled, for example, connected, to a cathode K of diode 10, and a terminal 604 coupled, preferably connected, to a gate terminal G of diode 10. When diode 10 and device 6 are effectively coupled and form the dipole 7 shown in FIG. 2, terminal 600 forms the anode terminal 700 of dipole 7 and terminal 602 forms the cathode terminal 702 of dipole 7. In other words, terminals 600 and 700 are coincident, with terminals 602 and 702 also being coincident. Still in other words, terminal 600 is connected to terminal 700 of dipole 7, with terminal 602 also being connected to terminal 702 of dipole 7.

Device 6 is configured to control diode 10, that is, to supply a control potential on gate G of diode 10, based on the potential difference between its terminals 600 and 602, that is, based on the potential difference between the terminals 700 and 702 of dipole 7. In the rest of the disclosure, the potential difference between terminals 600 and 602, respectively 700 and 702, corresponds to the potential of terminal 600, respectively 700, from which the potential of terminal 602, respectively 702, is subtracted. In other words, the potential difference between terminals 600 and 602, respectively 700 and 702, is referenced to terminal 600, respectively 700.

Figure 3:
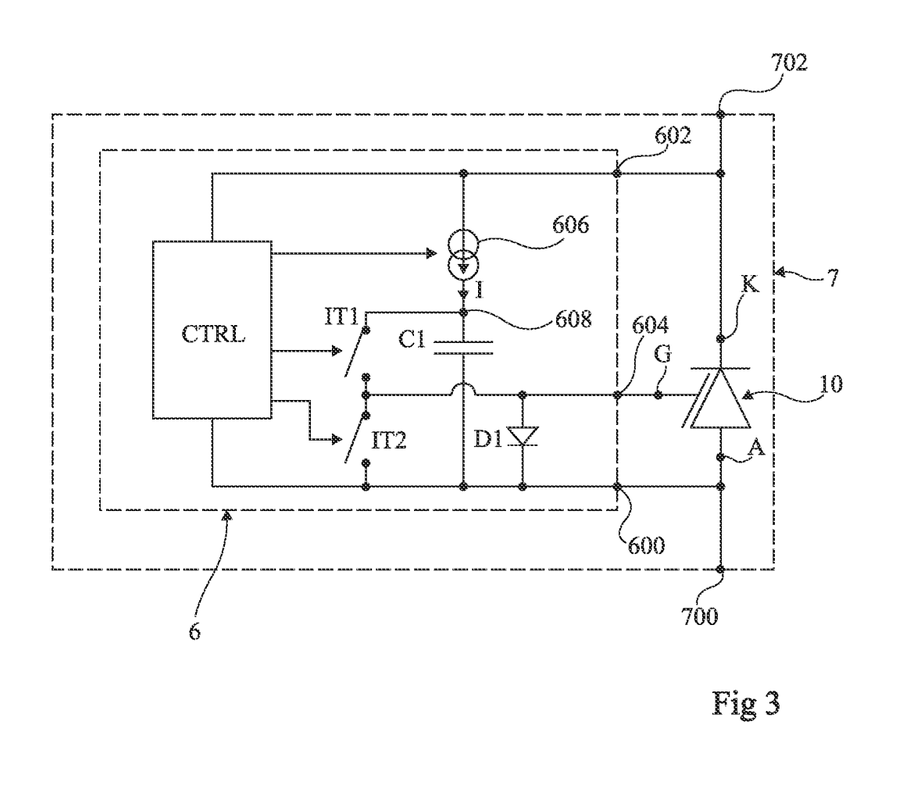
FIG. 3 schematically shows, in the form of a circuit, an embodiment of the control device of FIG. 2.

FIG. 3 schematically shows, in the form of a circuit, an embodiment of the control device 6 of FIG. 2. More particularly, FIG. 3 shows the dipole 7 of FIG. 2 or, in other words, FIG. 3 shows device 6 connected to the OFT diode that it controls, that is, diode 10 in this example. In FIG. 3, dipole 7 and device 6 are each delimited by dotted lines.

Device 6 comprises a current source 606. Current source 606 is connected between a node 608 of device 6 and terminal 602 of device 6. In other words, a terminal of the current source is coupled, preferably connected, to node 608, the other terminal of current source 606 being coupled, preferably connected, to terminal 602.

Current source 606 is controllable, that is, according to a control, or control signal, that it receives, it supplies or not a positive current I flowing from terminal 602 to node 608.

Device 6 comprises a capacitor C1. Capacitor C1 is connected between node 608 and terminal 600 of device 6. In other words, a terminal of capacitor C1 is coupled, preferably connected, to node 608, the other terminal of capacitor C1 being coupled, preferably connected, to terminal 600.

Device 6 comprises a diode D1 connected between terminals 604 and 600, the anode of diode D1 being on the side of terminal 604. In other words, the anode of diode D1 is coupled, preferably connected, to terminal 604, the cathode of diode D1 being coupled, preferably connected, to terminal 600. Diode D1 corresponds, for example, to a single diode, or to a plurality of diodes in series, which enables adjustment of the turn-on thresholds, or threshold voltage, of diode D1.

Device 6 comprises a switch IT1. Switch IT1 is connected between node 608 and terminal 604 of device 6. In other words, a terminal of switch IT1 is coupled, preferably connected, to node 608, the other terminal of switch IT1 being coupled, preferably connected, to terminal 604.

When switch IT1 is off, capacitor C1 may be charged by the current I delivered by current source 606.

When switch IT1 is on, it is configured to discharge capacitor C1 through diode D1, so that a non-zero positive potential, for example, referenced to the potential of terminal 600, is present on terminal 604, and thus applied to gate G of diode 10. The threshold voltage of diode D1 thus at least partially determines the value of the non-zero positive potential difference applied between terminals G and A of diode 10, when switch T1 is on and capacitor C1 discharges through diode D1.

Device 6 comprises a switch IT2. Switch IT2 is connected between terminals 600 and 604. In other words, switches IT1 and IT2 are series-connected between node 608 and terminal 600, switch IT1 being on the side of node 608, and the connection node between switches IT1 and IT2 corresponding to the terminal 604 of device 6. Still in other words, a terminal of switch T2 is coupled, preferably connected, to terminal 604, the other terminal of switch IT2 being coupled, preferably connected, to terminal 600.

When it is on, switch IT2 is configured to electrically couple terminals 604 and 600, that is, to short-circuit terminal 604 to terminal 600.

Switches IT1 and IT2 are configured not to be simultaneously on, however, switches IT1 and IT2 may be simultaneously off.

According to an embodiment, device 6 comprises a circuit CTRL. Circuit CTRL is configured to control current source 606 and switches IT1 and IT2 based on or from the potential difference between its terminals 602 and 600.

More particularly, according to an embodiment, circuit CTRL is configured to control current source 606 so that it supplies current I when the potential difference between terminals 600 and 602 is smaller than a threshold Th1. As an example, the negative threshold is zero. In other words, circuit CTRL is configured to control source 606 to charge capacitor C1 when diode 10 is reverse-biased.

According to an embodiment, circuit CTRL is further configured to control a turning on of switch IT2 when the potential difference between terminals 600 and 602 is smaller than a threshold Th2. As an example, threshold Th2 is negative or zero. As an example, threshold Th2 is smaller than threshold Th1. The turning on of switch IT2 when diode 10 is reverse-biased enables to short-circuit terminals G and A of diode 10, which results in a decrease in the leakage current in diode 10 with respect to the case where a non-zero positive potential difference would be applied between terminals G and A of reverse-biased diode 10.

According to an embodiment, circuit CTRL is further configured to control a turning on of switch IT1 when the potential difference between terminals 600 and 602 is greater than a threshold Th3. Threshold Th3 is positive. The turning on of switch IT1 when diode 10 is forward-biased enables provision of a positive non-zero potential difference between terminals 604 and 600, and thus between terminals G and A, which results in a decrease in the potential difference across diode 10 with respect to the case where a zero potential difference would be applied between terminals G and A of forward-biased diode 10.

According to an embodiment, circuit CTRL is powered with the potential difference between its terminals 600 and 602. In other words, no specific power supply is provided so that circuit CTRL can control source 606 and the above-described switches IT1 and IT2.

It could have been devised to replace diode 10 with a usual MOS ("Metal Oxide Semiconductor") transistor, which would have had its source coupled to terminal 700 and its drain connected to terminal 702. However, to turn on the MOS transistor when the potential difference between terminals 700 and 702 would have been positive, a potential would have had to be applied to the gate of the MOS transistor, which would have had to be sufficiently greater than that of its source. This would have required the provision of logic circuits and of a specific power supply, for example, a charge pump, or, for example, a circuit external to the device 6 having, for example, a supplementary secondary winding, which is not the case with control device 6.

It could also have been devised to replace diode 10 and its control device 6 with a usual (gateless) non-controllable diode, but the leakage current in the usual reverse-biased diode and the voltage drop across the usual forward-biased diode would then have been higher than with diode 10 and its control device 6.

According to an embodiment, circuit CTRL might only include resistive components, diodes, and a possible inductance (not shown in FIG. 3). Circuit CTRL is then simpler than a control circuit which would comprise comparators, for example, implemented by operational amplifiers utilizing a dedicated power supply, these amplifiers being, for example, configured to detect sign or polarity inversions of the potential difference between terminals K and A of diode 10.

More particularly, according to an embodiment, current source 606 and switches IT1 and IT2 are each implemented by a bipolar transistor. In this case, circuit CTRL implements the previously-described control of current source 606 and of switches IT1 and IT2, by correspondingly biasing the bipolar transistors based on the potential difference between terminals 600 and 602.

Figure 4:
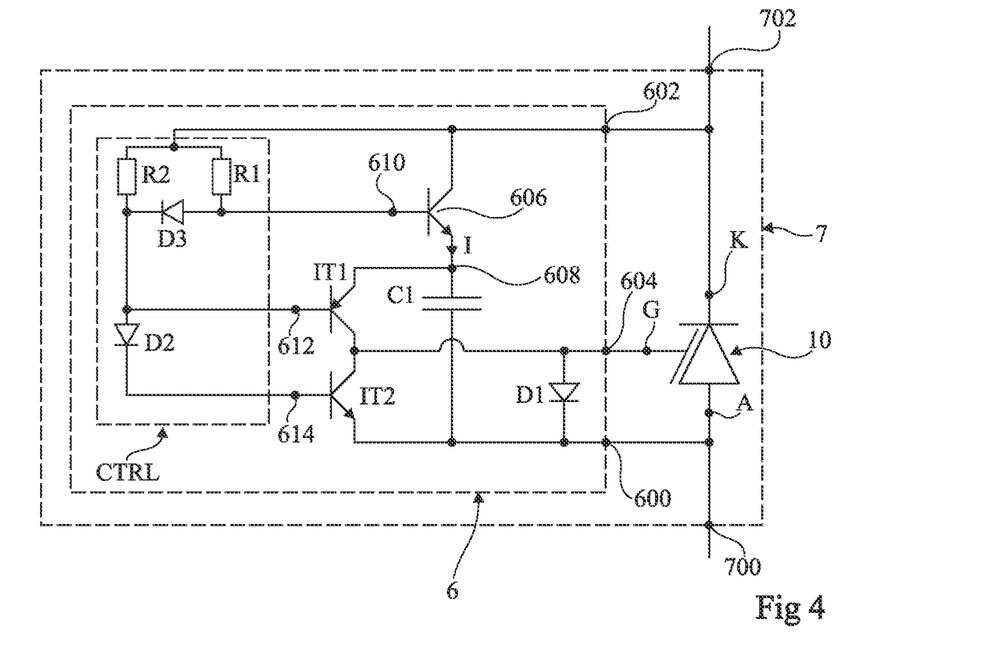
FIG. 4 schematically shows, in the form of a circuit, a more detailed embodiment of the control device of FIG. 3.

FIG. 4 schematically shows, in the form of a circuit, a more detailed embodiment of control device 6. The differences between the device 6 of FIG. 3 and that of FIG. 4 are here detailed. Further, as in FIG. 3, in FIG. 4, device 6 is shown as being connected to the diode that it controls, that is, in the present example, diode 10, the assembly defining dipole 7. In FIG. 4, elements 6, 7, and CTRL are delimited by dotted lines.

In this embodiment, current source 606 is implemented by an NPN-type bipolar transistor. The collector of transistor 606 is coupled, preferably connected, to terminal 602. The emitter of transistor 606 is coupled, preferably connected, to node 608. The base 610 of transistor 606 is coupled, preferably connected, to circuit CTRL.

In this embodiment, switch IT1 is implemented by a PNP-type bipolar transistor. The emitter of transistor IT1 is coupled, preferably connected, to node 608. The collector of transistor IT1 is coupled, preferably connected, to terminal 604. The base 612 of transistor IT1 is coupled, preferably connected, to circuit CTRL.

In this embodiment, switch IT2 is implemented by an NPN-type bipolar transistor. The emitter of transistor IT2 is coupled, preferably connected, to terminal 600. The collector of transistor IT2 is coupled, preferably connected, to terminal 604, and thus to the collector of transistor IT1. The base 614 of transistor IT2 is coupled, preferably connected, to circuit CTRL.

According to an embodiment, as illustrated in FIG. 4, circuit CTRL comprises a resistor or resistive component R1, resistor R1 coupling terminal 602 to the base 601 of transistor 606. In other words, a terminal of resistor R1 is coupled, preferably connected, to terminal 602, another terminal of the resistor being coupled, preferably connected, to the base 610 of transistor 606.

Resistor R1 enables, when the potential difference between terminals 600 and 602 is negative (diode 10 being reverse biased) and smaller than threshold Th1, turning on of transistor 606 and, more particularly, supply of a positive base current thereto. Transistor 606 then supplies current I to node 608.

According to an embodiment, as shown in FIG. 4, circuit CTRL also comprises a resistor or resistive element R2, resistor R2 coupling terminal 602 to base 612 of transistor IT1. In other words, a terminal of resistor R2 is coupled, preferably connected, to terminal 602, another terminal of the resistor being coupled, preferably connected, to base 612 of transistor IT1. Circuit CTRL further comprises a diode D2 connected between base 612 of transistor IT1 and base 614 of transistor IT2, the anode of diode D2 being on the side of base 612 of transistor IT1. In other words, the anode of diode D2 is coupled, preferably connected, to base 612 of transistor IT1, the cathode of diode D2 being coupled, preferably connected, to base 614 of transistor IT2. Thus, resistor R2 and diode D2 are series-connected between terminal 602 and base 614 of transistor IT2, the base 612 of transistor IT1 being coupled or connected to the node of connection of diode D2 to resistor R2. Further, circuit CTRL comprises a diode D3 connected between base 610 of transistor 606 and base 612 of transistor IT1, the anode of diode D3 being on the side of base 610 of transistor 606. In other words, the anode of diode D3 is coupled, preferably connected, to the terminal of resistor R1 opposite to terminal 602, the cathode of diode D3 being coupled, preferably connected, to the terminal of resistor R2 opposite to terminal 602.

Preferably, the turn-on threshold of diode D3, which may correspond to a single diode or to a plurality of series-connected diodes, is substantially equal, for example, equal, to the potential difference between base 610 and the emitter of transistor 606 when the latter delivers current I, that is, to the turn-on threshold, or threshold voltage, of the base-emitter diode of transistor 606. Thus, when transistor 606 delivers current I, the potential difference between node 608 and base 612 of transistor IT1 is zero, whereby transistor IT1 is off and capacitor C1 charges.

The threshold voltage of diode D2, which may correspond to a single diode or to a plurality of diodes in series, at least partly determines a maximum value of the potential difference across capacitor C1, and thus a maximum value of the potential of node 608. Indeed, when switch IT2 is closed (on), switch T1 is open (off), and source 606 delivers current I, the potential of node 608 is at most equal to the sum of the potential of terminal 600, of the base-emitter voltage of transistor IT2, of the potential difference across diode D2, of the potential difference across diode D3, and of the base-emitter voltage of transistor 606.

As an example, when: diode D2 corresponds to two diodes in series, each having a turn-on threshold equal to a value Vj, for example, equal to 0.7 V; the base-emitter voltage of transistor IT2 is equal to Vj when transistor IT2 is on; and the potential difference across diode D3 and the base-emitter voltage of transistor 606 becomes zero, then the maximum voltage across capacitor C1 is equal to 3*Vj. In other words, the voltage across capacitor C1 is regulated based on the value 3*Vj.

In this embodiment, as soon as the potential difference between terminals 600 and 602 is sufficiently negative (reverse-biased diode 10) for a current to flow through resistor R2 and diode D2, from terminal 602 to base 614 of transistor IT2, transistor IT2 turns on and short-circuits terminals 604 and 600. Thus, in this embodiment, the threshold voltage of diode D2 at least partly determines threshold Th2, which is then negative.

Further, in this embodiment, transistor 606 turns on when the potential of terminal 602 is sufficiently higher than the potential of node 608. Thus, in this embodiment, threshold Th1 is at least partly determined by the threshold voltage of diode D1, due to the fact that the threshold voltage of diode D1 at least partly determines the potential of node 608 when switch IT1 is on and the diode 10 is forward-biased.

In the device 6 of FIG. 4, when the potential difference between terminals 600 and 602 is positive (diode 10 forward biased), transistors IT2 and 606 are off. Further, when a positive current flowing from terminal 600 to terminal 602 is supplied to terminal 600 and the potential of node 608 is sufficiently higher than the potential of terminal 602, transistor T1 turns on. When the potential difference between the terminals 600 and 602 is positive and the transistors IT2 and 606 are off, the potential difference between the nodes 608 and 602 is defined by the sum of the potential difference between the terminals of the capacitor C1 and of the voltage drop across diode 10. Consequently, the threshold voltage of diode 10 at least partly determines threshold Th3. In other words, threshold Th3 is at least partly determined by the threshold voltage of diode D2, due to the fact that the threshold voltage of diode D2 at least partly determines the potential difference between the terminals of the capacity C1 just before the switch IT1 turns to the on-state.

It will be within the abilities of those skilled in the art to modify the values of thresholds Th1, Th2, and Th3, and/or the maximum value on which the potential of node 608 is regulated, for example, by adapting the value of the threshold voltage of diode D2. Further, it will be within the abilities of those skilled in the art to modify the value of the potential difference applied between terminals G and A of diode 10 when transistor IT1 is on, for example, by modifying the turn-on threshold of diode D1 and possibly by adapting the value of capacitance C1.

Figure 5:
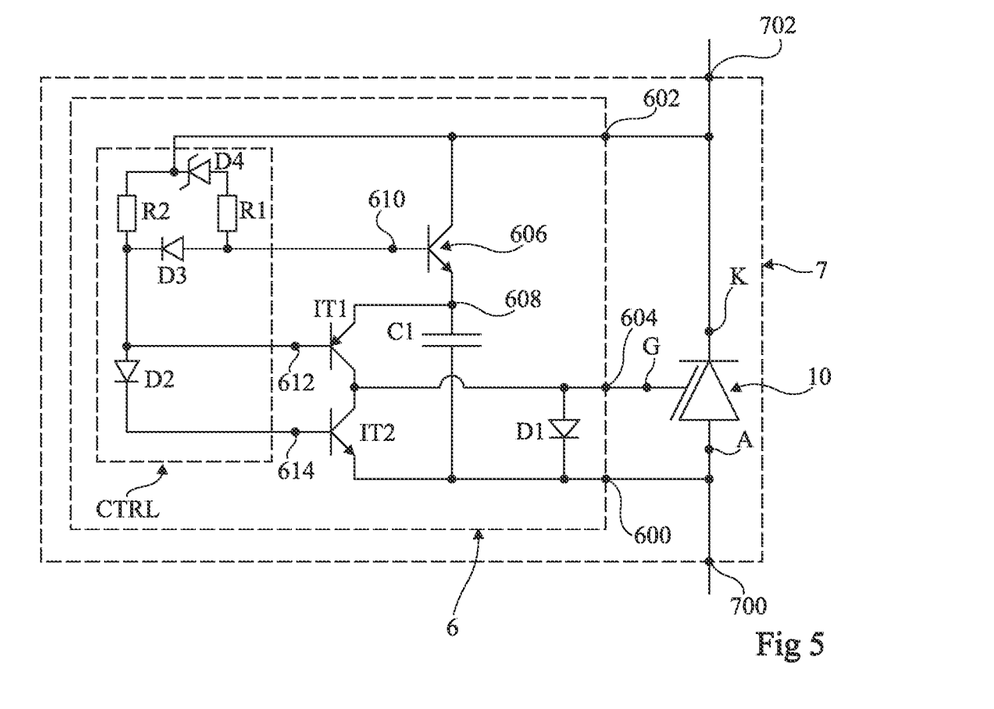
FIG. 5 schematically shows, in the form of a circuit, an alternative embodiment of the control device of FIG. 4.

FIG. 5 schematically shows, in the form of a circuit, an alternative embodiment of the control device 6 of FIG. 4. The differences between the device 6 of FIG. 4 and that of FIG. 5 are here detailed. In FIG. 5, as in FIGS. 3 and 4, device 6 is shown as being connected to the diode that it controls, that is, in the present example, diode 10, and the assembly of device 6 and of diode 10 defining dipole 7. In FIG. 5, elements 6, 7, and CTRL are delimited by dotted lines.

The device 6 of FIG. 5 differs from that of FIG. 4 in that it comprises a diode D4, preferably, a Zener diode, series-connected with resistor R1, between terminal 602 and base 610 of transistor 606, the anode of diode D4 being on the side of the base 610 of transistor 606. Diode D4 may correspond to a single diode or to a plurality of series-connected diodes.

In this alternative embodiment, for transistor 606 to be on and to deliver the charge current I of capacitor C1, the potential of terminal 602 should be sufficiently higher than the potential of node 608 to allow the turning on of the reverse-biased Zener diode D4 and the delivery of a base current to transistor 606. Zener diode D4 thus enables lowering of the value of threshold Th1 conditioning the delivery of charge current I of capacitor C1.

When dipole 7 forms part of a switched-mode power supply, for example, that of FIG. 2, threshold Th1 is, for example, selected by adapting the value of the turn-on threshold of the reverse-biased diode D4, to be smaller than the maximum (in absolute value) negative potential difference that may be present between terminals 600 and 602 when the switched-mode power supply operates in discontinuous conduction mode (DCM). As a result, in discontinuous conduction mode, capacitor C1 is not charged and current source 606 thus delivers no charge current I to capacitor C1.

This enables avoidance, between a phase where diode 10 is forward-biased and a phase where diode 10 is reverse-biased and has its terminals G and A short-circuited by transistor IT2, of application of a non-zero potential difference between terminals G and A of diode 10, whereas the conduction of the forward-biased diode 10 is not immediately followed by a potential difference between the terminals K and A of diode 10 low enough, for example negative, to turn off the diode 10, which is generally the case in a switched-mode power supply operating in DCM mode. In other words, this enables avoidance of applying a non-zero positive potential difference between terminals G and A of diode 10, while diode 10 operates in quadrant Q1, which would result in an increases in losses, which could be assimilated to switching losses in the switched-mode power supply.

According to another alternative embodiment, not illustrated, to limit switching losses in a switched-mode power supply operating in discontinuous conduction mode, rather than diode D4 enabling to lower threshold Th1, device 6 comprises a circuit configured to short-circuit terminals 604 and 600 as soon as the potential difference between terminals K and A of diode 10 is weakly positive, that is to say, for example, when this potential difference is greater than the turn-on threshold of diode 10 but that the difference between this potential difference and the turn-on threshold of the diode 10 is less than 0.1 V, for example less than 0.05 V, or even less than 0.01 V. This weakly positive potential difference corresponds, for example, to a direct current in the diode 10 less than or equal to 100 mA. The implementation of this variant embodiment using logic circuits is within the abilities of the person skilled in the art.

Figure 6:
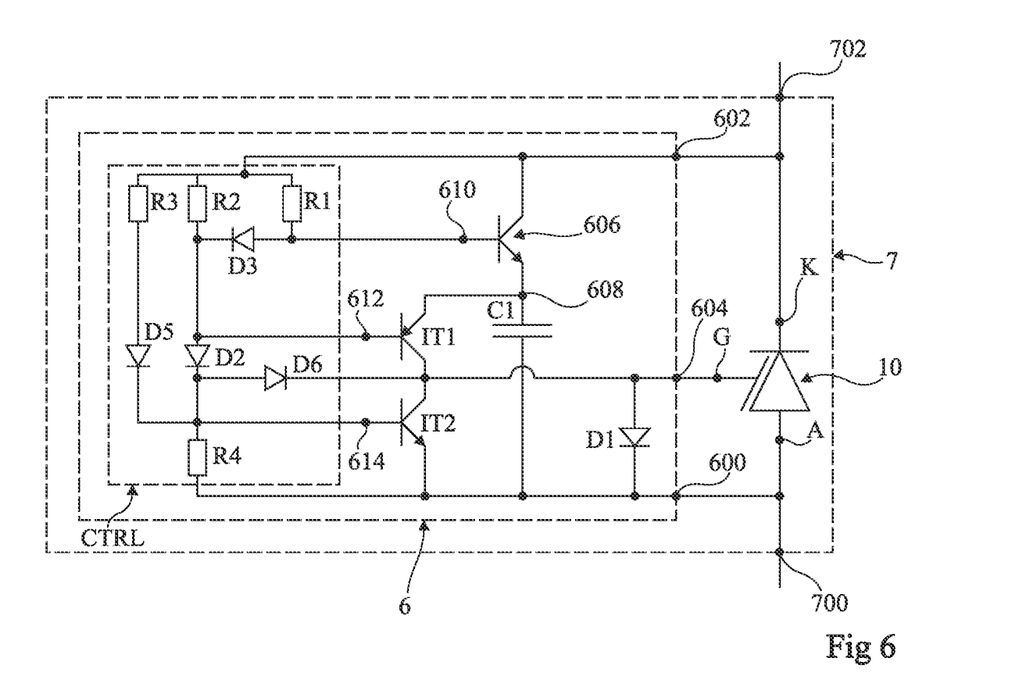
FIG. 6 schematically shows, in the form of a circuit, another alternative embodiment of the control device of FIG. 4.

FIG. 6 schematically shows in the form of a circuit another alternative embodiment of the control device 6 of FIG. 4. The differences between the device 6 of FIG. 4 and that of FIG. 6 are here detailed. In FIG. 6, as in FIGS. 3, 4, and 5, device 6 is shown as being connected to the diode that it controls, that is, in this example, diode 10, the assembly of device 6 and of diode 10 defining dipole 7. In FIG. 6, elements 6, 7, and CTRL are each delimited by dotted lines.

In this variant, threshold Th2 is not at least partly determined by the threshold voltage of diode D2. More particularly, in this alternative embodiment, the maximum voltages across capacitor C1 and threshold Th2 are decorrelated from each other. Indeed, in this variation, it is here provided for threshold Th2 to be lower than in the previously-described embodiments and variants, without this modifying the maximum voltage that may be present across capacitor C1.

For this purpose, device 6, and more particularly its circuit CTRL, comprises a diode D5 in series with a resistor R3, between terminal 602 and base 614 of transistor IT2. Diode D5 corresponds to a single diode or to a plurality of diodes in series. The cathode of diode D5 is on the side of the base 614 of transistor IT2. In other words, the cathode of diode D5 is coupled, for example, connected, to base 614 of transistor IT2.

In this alternative embodiment, as soon as the negative potential difference between terminals 600 and 602 (diode 10 reverse biased) is greater than the threshold voltage of diode D5, transistor IT2 turns on and short-circuits terminals 604 and 600. By selecting a diode D5 having a turn-on threshold smaller than that of diode D2, this enables decreasing (in absolute value) the value of threshold Th2, and thus short-circuiting of terminals G and A of reverse-biased diode 10 faster to decrease the leakage current thereof.

Thus, in this variant, the voltage of diode D5 at least partly determines threshold Th2.

According to an embodiment, circuit CTRL further comprises an optional resistor R4 connected between base 614 of transistor IT2 and terminal 600. This resistor enables adjusting of the biasing of transistor IT2 in the on-state. Although the provision of resistor R4 is described in relation with the alternative embodiment of FIG. 6, resistor R4 may also be provided in the embodiments and variants described in relation with FIGS. 4 and 5, as well as in the alternative embodiment which will be described hereafter in relation with FIG. 7.

According to an embodiment, circuit CTRL further comprises a diode D6 for desaturating transistor IT2. Diode D6 is connected between the base 614 and the collector 604 of transistor IT2, the anode of diode D6 being on the side of base 614 of transistor IT2. Diode D6 enables reduction of the saturation in the transistor IT2 in order to accelerate the transition to the off-state of the latter. A similar solution could be envisaged for transistor IT1. Although the provision of diode D6 is described in relation with the alternative embodiment of FIG. 6, diode D6 may also be provided in the embodiments and variants described in relation with FIGS. 4 and 5, as well as in the alternative embodiment which will now be described in relation with FIG. 7.

Figure 7:
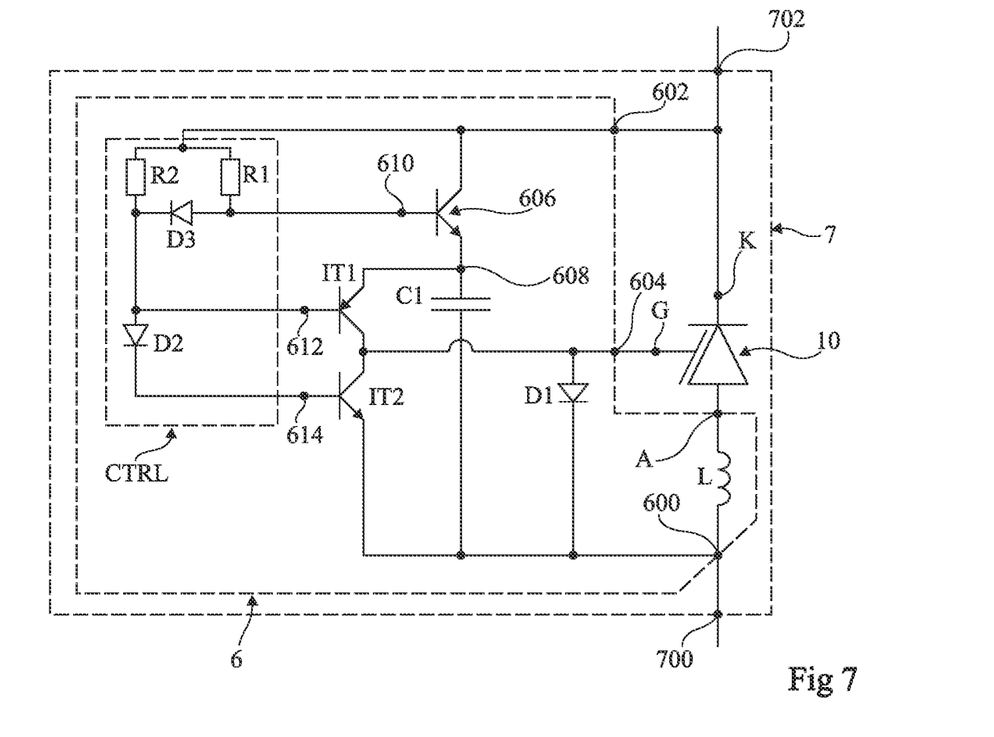
FIG. 7 schematically shows, in the form of a circuit, still another alternative embodiment of the control device of FIG. 4.

FIG. 7 schematically shows, in the form of a circuit, an alternative embodiment of the control device 6 of FIG. 4. The differences between the device 6 of FIG. 4 and that of FIG. 7 are here detailed. In FIG. 7, as in FIGS. 3, 4, 5, and 6, device 6 is shown as being connected to the diode that it controls, that is, in this example, diode 10, the assembly of device 6 and of diode 10 defining dipole 7. In FIG. 7, elements 6, 7, and CTRL are each delimited by dotted lines.

In this variant, applicable to the previously-described embodiments and variants, device 6 comprises an inductance L coupling terminal 600 of device 6 to anode A of diode D. In other words, inductance L is connected between terminal 600 and anode A of diode 10. Still in other words, inductance L has a terminal coupled, preferably connected, to terminal 600, and another terminal coupled, for example, connected, to anode A of diode 10. Thus, as compared with the previously-described embodiments and variants where terminal 600 was, for example, connected to anode A of diode 10, in this variant, terminal 600 is coupled to anode A of diode 10 by inductance L.

Inductance L conducts the same current as diode 10. Inductance L enables limiting of the amplitude of the potential difference between terminals G and A of diode 10 when transistor IT1 turns on, or, in other words, enables avoidance of an overvoltage between terminals G and A of diode 10. Further, inductance L enables the potential difference between terminals G and A of diode 10 to become zero faster when diode 10 switches from a forward biasing to a reverse biasing.

As an example, inductance L has a value in the range from a few nH to a few tens of nH, for example, from 5 to 30 nH, the value of inductance L being for example equal to 10 nH. However, it will be within the abilities of those skilled in the art to adapt the value of inductance L according to the variations of the current in diode 10, particularly to the slope of such current variations. The value of the inductance L could be adjusted, for example, by adjusting the length of the conductive tracks or of the connections of the circuit.

In the previously-described embodiments and variants, device 6 and the diode 10 that it controls define dipole 7. Device 6 and diode 10 are preferably implemented inside and on top of a same portion of a semiconductor substrate, for example, substrate 20 (FIG. 1). However, it may be provided for device 6 to correspond to a first component implemented inside and on top of a first semiconductor substrate, and for the OFT diode that it controls to be implemented inside and on top of another semiconductor substrate.

Although embodiments and variants have been described hereinabove in the case where device 6 controls the OFT diode 10 described in relation with FIG. 1, it will be within the abilities of those skilled in the art to adapt device 6 to other controllable diodes, for example, to other OFT diodes.

Further, although the case where dipole 7 forms part of switched-mode power supply 5 (FIG. 2) has been described as an example, it will be within the abilities of those skilled in the art to provide dipole 7 in other circuits, for example, in other power circuits such as switched-mode power supplies different from that of FIG. 2, or also voltage-rectifying bridges.

According to one embodiment, the diode 10 is an OFT diode. An OFT diode is conductive when the voltage Vak between its anode and its cathode, referenced to said cathode, is positive (forward-biased state) and the voltage Vga between its gate and its anode, referenced to said anode, is null or positive. Further, an OFT diode is blocked when the voltage Vak is negative (reversed-biased state) and the voltage Vga is null or negative. In such an OFT diode, in the forward-biased state, the higher the voltage Vga, the lower the voltage Vak. However, at the time of the switching from the forward-biased state to the reverse-biased state, the greater the voltage Vga during the forward-biased state, the slower the discharge of its gate at the time of this switching, and the greater the leakage currents in the diode at the time of this switching.

Thus, according to one embodiment, the turn-on threshold of diode D1 is determined by a compromise between the voltage Vak of forward-biased diode 10 and the leakage currents in diode 10 at the time of its switching from forward-biased state to reverse-biased state.

Various embodiments and variants have been described. Certain features of these various embodiments and variants may be combined, and other variants will occur to those skilled in the art.

The values of capacitor C1, the values of the resistances of circuit CTRL, and the threshold voltages of the diodes of circuit CTRL may be selected according to the targeted application and/or to the electric characteristics of the OFT diode that device 6 is intended to control.

The invention claimed is:

1. A device, comprising:
an electronic device including:
a controllable current source coupled between a first node and a first terminal, the first terminal being coupled to a cathode of a controllable diode;
a capacitor coupled between the first node and a second terminal, the second terminal being coupled to an anode of the controllable diode;
a first switch coupled between the first node and a third terminal, the third terminal being coupled to a gate of the controllable diode;
a second switch coupled between the second terminal and the third terminal; and
a first diode coupled between the third terminal and the second terminal, an anode of the first diode being coupled to the third terminal.

2. The device according to claim 1, further comprising a circuit configured to control the controllable current source, the first switch, and the second switch based upon a potential difference between the first terminal and the second terminal.

3. The device according to claim 2, wherein the circuit is configured to:
control the controllable current source to deliver a current to the capacitor when said potential difference is smaller than a first threshold;
control the first switch to an on-state when said potential difference is greater than a second threshold; and
control the second switch to an on-state when said potential difference is lower than a third threshold.

4. The device according to claim 3, wherein:
the controllable current source is a first bipolar transistor having an emitter coupled to the first node and a collector coupled to the first terminal;
the first switch is a second bipolar transistor having an emitter coupled to the first node and a collector coupled to the third terminal; and
the second switch is a third bipolar transistor having an emitter coupled to the second terminal and a collector coupled to the third terminal.

5. The device according to claim 4, wherein said circuit comprises:
a first resistor coupling the first terminal to a base of the first bipolar transistor;
a second resistor coupling the first terminal to a base of the second bipolar transistor;
a second diode coupled between the base of the first bipolar transistor and the base of the second bipolar transistor, an anode of the second diode being coupled to the base of the first bipolar transistor; and
a third diode coupled between the base of the second bipolar transistor and a base of the third bipolar transistor, an anode of the third diode being coupled to the base of the second bipolar transistor.

6. The device according to claim 5, wherein a threshold voltage of the second diode is equal to a threshold voltage of a base-emitter diode of the first bipolar transistor.

7. The device according to claim 5, wherein a maximum voltage across the capacitor is at least partly determined by a threshold voltage of the third diode.

8. The device according to claim 5, wherein the first threshold is at least partly determined by a threshold voltage of the first diode.

9. The device according to claim 5, wherein said circuit comprises a diode series-connected with the first resistor between the first terminal and the base of the first bipolar transistor, the first threshold being at least partially determined by a reverse conduction threshold voltage of said diode.

10. The device according to claim 9, wherein the diode comprises a Zener diode.

11. The device according to claim 5, wherein the second threshold is at least partly determined by a threshold voltage of the third diode.

12. The device according to claim 11, wherein the second threshold is at least partially determined by a threshold voltage of the controllable diode.

13. The device according to claim 5, wherein the third threshold is at last partly determined by a threshold voltage of the third diode.

14. The device according to claim 5, wherein the circuit further comprises a diode in series with a third resistor between the first terminal and the base of the third bipolar transistor, the third threshold being at least partly determined by a threshold voltage of said diode.

15. The device according to claim 5, wherein the circuit further comprises a resistor coupled between the base of the third bipolar transistor and the second terminal.

16. The device according to claim 5, wherein the circuit comprises a diode for desaturating the third bipolar transistor, coupled between the base and the collector of the third bipolar transistor.

17. The device according to claim 3, wherein the first threshold is a negative potential.

18. The device according to claim 3, wherein the first threshold is ground.

19. The device according to claim 3, wherein the second threshold is a positive potential.

20. The device according to claim 3, wherein the second threshold is ground.

21. The device according to claim 3, wherein the third threshold is a negative potential.

22. The device according to claim 3, wherein the third threshold is ground.

23. The device according to claim 1, further comprising an inductance coupled between the second terminal and the anode of the controllable diode.

24. The device according to claim 1, wherein the controllable diode is an oxide field trench (OFT) diode including a plurality of structures, each of the plurality of structures comprising, in a trench of a substrate, a first conductive region separated from the substrate by a first distance, and a second conductive region extending in the trench deeper than the first conductive region, the controllable diode being defined by at least one transistor having at least a channel region extending between two of the trenches, the first conductive region defining a gate of the at least one transistor and a gate of the controllable diode.

25. The device according to claim 24, wherein the first distance is shorter than 10 nm.

26. The device according to claim 1, wherein the first terminal of the electronic device defines a cathode of a dipole and the second terminal of the electronic device defines an anode of the dipole; and further comprising said controllable diode having a cathode coupled to the first terminal of the electronic device, an anode coupled to the second terminal of the electronic device, and a gate coupled to the third terminal of the electronic device.

27. The device of claim 26, wherein the device is configured to define a switched-mode power supply.

28. The device of claim 26, wherein the controllable diode comprises an oxide field trench (OFT) diode.

29. The device of claim 1, wherein the device is configured to define a switched-mode power supply.

30. An electronic device, comprising:
a transformer coil having a first terminal and a second terminal;
a dipole having a cathode coupled to the second terminal of the transformer coil and an anode coupled to a reference node; and
a capacitor coupled between the first terminal of the transformer coil and the reference node;
wherein the dipole comprises:
a controllable diode having an anode coupled to the reference node and a cathode coupled to the second terminal of the transformer coil; and
a control device having inputs coupled to the second terminal of the transformer coil and the reference node, the control device configured to apply a control signal to a gate of the controllable diode based upon a difference between a potential at the cathode of the controllable diode and a potential at the anode of the controllable diode.

31. The electronic device of claim 30, wherein the dipole further comprises:
a controllable current source coupled between the cathode of the controllable diode and a first node;
a second capacitor coupled between the first node and the reference node;
a first switch coupled between the first node and the gate of the controllable diode, wherein the control device is configured to control the first switch;
a second switch coupled between the gate of the controllable diode and the reference node, wherein the control device is configured to control the second switch; and
a first diode having an anode coupled to the gate of the controllable diode and a cathode coupled to the reference node.

32. The electronic device of claim 31, wherein the dipole further comprises an inductor connected between the anode of the controllable diode and the reference node.

33. The electronic device of claim 31,
wherein the controllable current source comprises a first transistor having a first conduction terminal connected to the cathode of the controllable diode, a second conduction terminal connected to the first node, and a control terminal; and
wherein the control device comprises:
a first resistor coupled between the cathode of the controllable diode and the control terminal of the first transistor;
a second resistor coupled between the cathode of the controllable diode and a control terminal of the first switch;
a second diode having an anode coupled to the control terminal of the first switch and a cathode coupled to a control terminal of the second switch; and
a third diode having an anode coupled to the control terminal of the first transistor and a cathode coupled to the control terminal of the first switch.

34. The electronic device of claim 33, wherein the control device further comprises a fourth diode having an anode connected to the first resistor and a cathode connected to the cathode of the controllable diode to thereby coupled the first resistor between the control terminal of the first transistor and the cathode of the controllable diode.

35. The electronic device of claim 34, wherein the fourth diode comprises a Zener diode.

36. The electronic device of claim 33, wherein the control device further comprises:
a fifth diode having a cathode coupled to the control terminal of the second switch, and an anode;
a third resistor coupled between the anode of the fifth diode and the cathode of the controllable diode;
a fourth resistor coupled between the control terminal of the second switch and the reference node; and
a sixth diode having an anode coupled to the cathode of the second diode and a cathode coupled to the gate of the controllable diode.

* * * * *